United States Patent [19]
Ueda

[11] Patent Number: 5,387,883
[45] Date of Patent: Feb. 7, 1995

[54] QUADRATURE MODULATOR HAVING CONTROLLED PHASE SHIFTER

[75] Inventor: Hideki Ueda, Tokyo, Japan

[73] Assignee: NEC Corporation, Tokyo, Japan

[21] Appl. No.: 63,693

[22] Filed: May 20, 1993

[30] Foreign Application Priority Data

May 20, 1992 [JP] Japan .................. 4-152932

[51] Int. Cl.⁶ .................. H03C 1/52; H04L 27/36
[52] U.S. Cl. .................. 332/103; 332/167; 375/39; 375/43; 375/61
[58] Field of Search .................. 332/103, 104, 105, 151, 332/152, 167, 168, 169; 375/39, 43, 61, 67, 52; 455/42, 46, 110, 126

[56] References Cited

U.S. PATENT DOCUMENTS 4,216,542 8/1980 Hermesmeyer .................. 332/103 X
4,574,244 3/1986 Head .................. 375/39 X

FOREIGN PATENT DOCUMENTS 0265218 4/1988 European Pat. Off. .
0477720 4/1992 European Pat. Off. .

Primary Examiner—Siegfried H. Grimm
Attorney, Agent, or Firm—Sughrue, Mion, Zinn, Macpeak & Seas

[57] ABSTRACT

A quadrature modulation circuit of the present invention has a phase shifter whose shifting amount is fixed at 90 degrees, a minute amount-phase shifter whose shifting amount is variable, a detector for detecting a RF signal supplied from the quadrature modulation circuit by a direct voltage signal, and a control circuit for generating a control signal in accordance with a direct voltage signal from the detector. Phase shifting amount of the minute amount-phase shifter is adjusted by the control signal whereby a total amount of the phase shifting is maintained at 90 degrees.

2 Claims, 6 Drawing Sheets

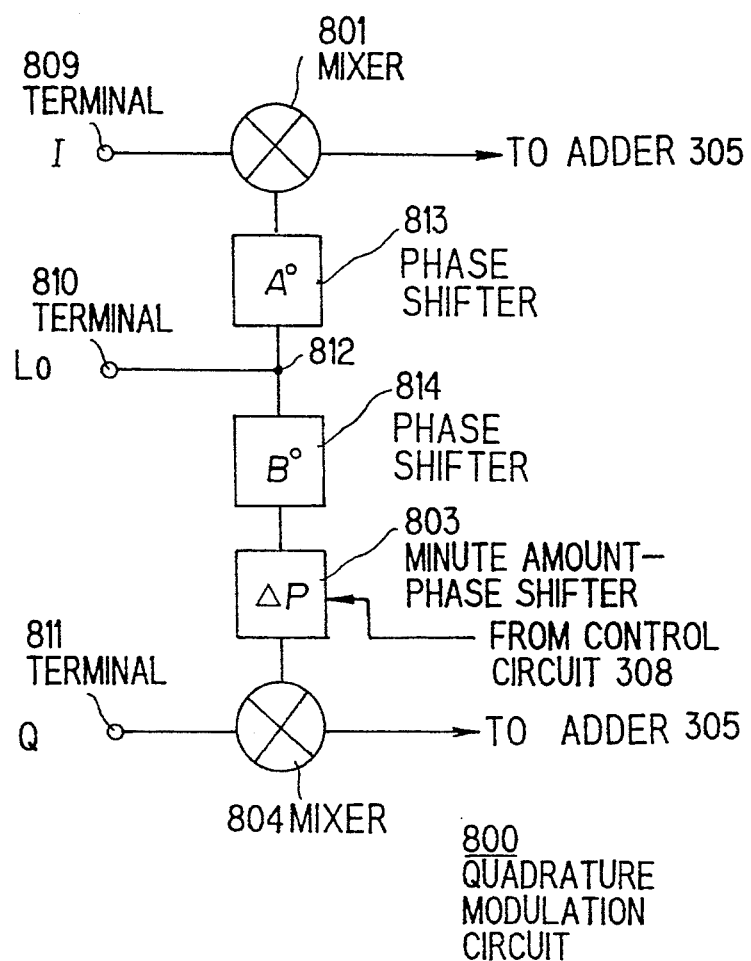

QUADRATURE MODULATOR HAVING CONTROLLED PHASE SHIFTER

FIELD OF THE INVENTION

This invention relates to a quadrature modulation circuit, and more particularly, to a quadrature modulation circuit used in a digital radio communication system.

BACKGROUND OF THE INVENTION

A conventional quadrature modulation circuit includes a divider for dividing a local signal into two local signals, a phase shifter for shifting a phase of one of the divided local signals whereby two orthogonal local signals having a relative phase difference of 90 degrees are obtained, two mixers for combining two baseband signals with the orthogonal local signals, respectively, and an adder for adding output signals of the mixers. The output signal of the quadrature modulation circuit is an RF (radio frequency) signal thus modulated to be transmitted to another station.

According to the conventional quadrature modulation circuit, however, there is a disadvantage/in that the shifting amount of the phase shifter is difficult to be maintained at 90 degrees precisely, because the shifting amount is affected by a printed pattern connected to the phase shifter and the like. As a result, the characteristics of a quadrature modulation will be deteriorated.

SUMMARY OF THE INVENTION

Accordingly, it is an object of the invention to provide a quadrature modulation circuit in which a shifting amount of a phase shifter can be maintained at a predetermined degrees precisely.

It is a further object of the invention to provide a quadrature modulation circuit in which two local signals having a precise phase difference of 90 degrees are obtained.

According to the invention, a quadrature modulation circuit includes: means for supplying a local signal and two baseband signals; means for dividing the local signal into two local signals; means for shifting a phase of at least one of said two local signals to provide a relative phase difference of 90 degrees therebetween; a first mixer for combining the first baseband signal with a first one of the two local signals, whereby a first combined signal is obtained; a second mixer for combining the second baseband signal with a second one of the two local signals, whereby a second combined signal is obtained; means for adding the first and second combined signals; and means for controlling the shifting means in accordance with an output signal of the adding means, whereby the two local signals are adjusted to have a relative phase difference of 90 degrees.

The other objects and features of the invention will become understood from the following description with reference to the accompanying drawings.

BRIEF DESCRIPTION OF THE DRAWINGS

FIG. 8 is a block diagram showing a quadrature modulation circuit of a second preferred embodiment according to the invention.

DESCRIPTION OF THE PREFERRED EMBODIMENTS

For better understanding the background of the present invention, the basic principle of the technology is first described hereinafter with reference to FIGS. 1 and 2.

Figure 1:
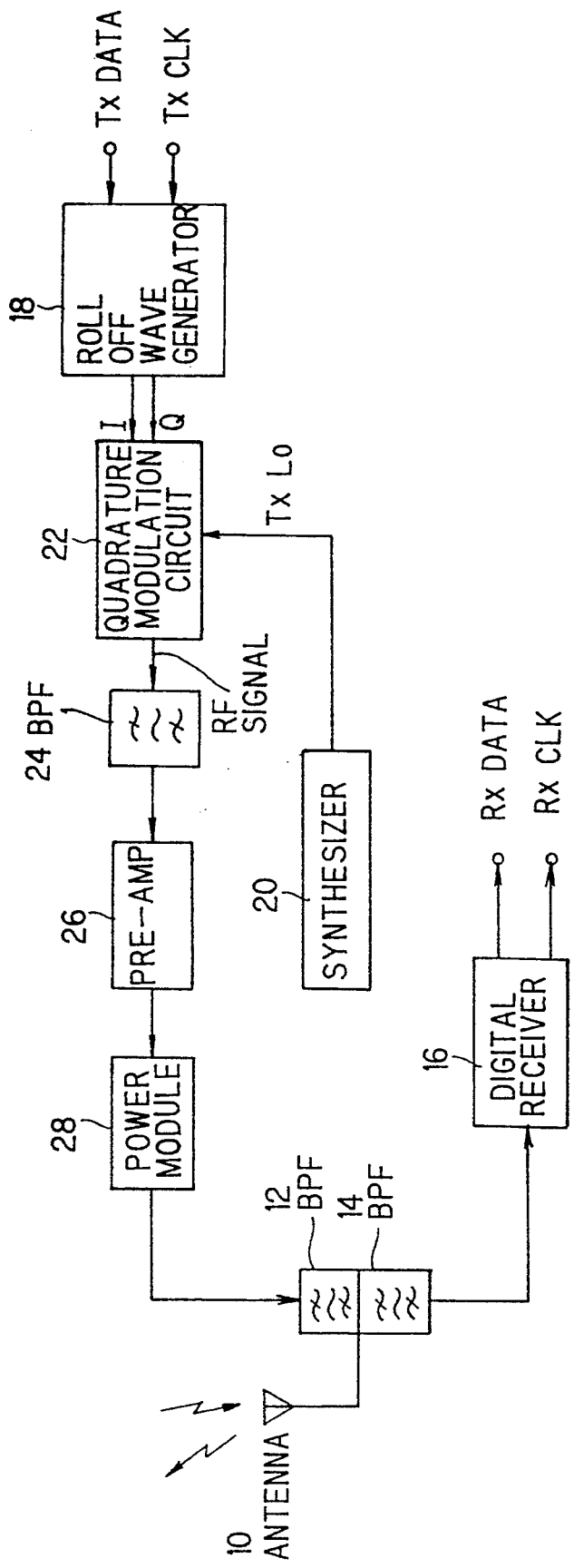
FIG. 1 is a block diagram showing a conventional digital radio communication system.

FIG. 1 shows a conventional digital radio communication system, which includes an antenna 10, two BPFs (band-pass filter) 12 and 14 connected to the antenna 10, a digital receiver 16 connected to the BPF 14, a roll-off wave generator 18, a synthesizer 20, a quadrature modulation circuit 22 connected to the roll-off wave generator 18 and the synthesizer 20, a BPF 24 connected to the quadrature modulation circuit 22, a pre-amplifier 26 connected to the BPF 24, and a power module 28 connected to the pre-amplifier 26 and the BPF 12.

In the radio communication system, when a radio signal is received from another station by the antenna 10, the radio signal is supplied through the BPF 14 to the digital receiver 16. The digital receiver 16 generates a received data signal R×DATA and a received clock signal R×CLK in accordance with the received radio signal.

On the other hand, when a transmission data signal T×DATA and a transmission clock signal T×CLK are supplied to the roll-off wave generator 18, baseband signals "I" and "Q" are generated in accordance with the data signals and are supplied therefrom to the quadrature modulation circuit 22. When a local signal "T×L$_O$" is supplied to the quadrature modulation circuit 22, the baseband signals "I" and "Q" are quadratically combined with the local signal, whereby a RF (radio frequency) signal thus modulated is obtained. The RF signal is supplied from the quadrature modulation circuit 22 through the BPF 24, the pre-amplifier 26, the power module 28 and the BPF 12 to the antenna 10, whereby the RF signal is transmitted to another station.

Figure 2:
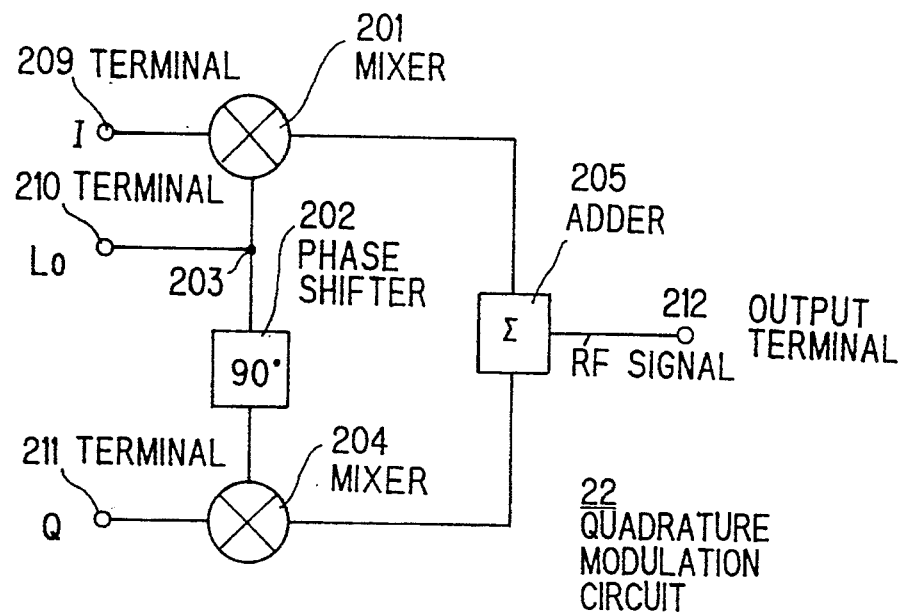
FIG. 2 is a block diagram showing a conventional quadrature modulation circuit.

FIG. 2 shows the quadrature modulation circuit 22, which includes two input terminals 209 and 211 for the baseband signals "I" and "Q", an input terminal 210 for the local signal "L$_O$" connected to a node 203, a mixer 201 connected to the input terminal 209 and the node 203, a phase shifter 202 connected to the node 203, a mixer 204 connected to the input terminal 211 and the phase shifter 202, an adder connected to the mixers 201 and 204, and an output terminal 212 connected to the adder 205.

In operation, when the local signal "L$_O$" is supplied to the input terminal 210, the local signal "L$_O$" is divided at the node into two local signals. The two local signals "L$_O$" are supplied to the mixer 201 and the phase shifter 202. Thus, the baseband signal "I" is combined with the local signal "L$_O$". The combined signal is supplied from the mixer 201 to the adder 205.

On the other hand, when the other local signal "$L_O$" is supplied to the phase shifter 202, so that the local signal "$L_O$" is phase-shifted by 90 degrees, and then the phase shifted local signal is supplied to the mixer 204. Thus, the baseband signal "Q" is combined with the phase shifted local signal. The modulated signal is supplied to the adder 205.

Next, the combined signals from the mixers 201 and 204 are added by the adder 205, whereby the RF signal thus modulated is obtained. The RF signal is supplied through the output terminal 212 to the following stage.

According to the conventional quadrature modulation circuit 200, however, there is a disadvantage in that the shifting amount of the phase shifter 202 is difficult to be maintained at 90 degrees precisely, as described before.

Figure 3:
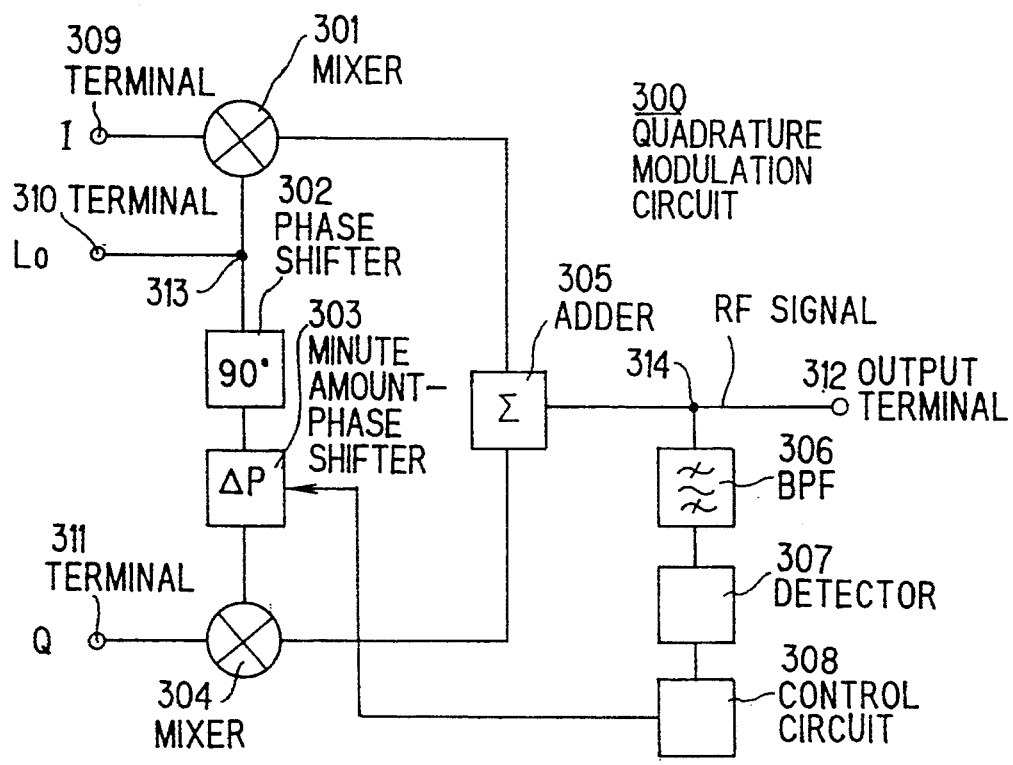
FIG. 3 is a block diagram showing a quadrature modulation circuit of a first preferred embodiment according to the invention.

FIG. 3 shows a quadrature modulation circuit 300 of a first preferred embodiment according to the invention. The quadrature modulation circuit 300 includes two input terminals 309 and 311 for baseband signals "I" and "Q", an input terminal 310 for a local signal "$L_O$" connected to a node 313, a mixer 301 connected to the input terminal 309 and the node 313, a phase shifter 302 connected to the node 313, a minute amount-phase shifter 303 connected in series to the phase shifter 302, a mixer 304 connected to the input terminal 311 and the minute amount-phase shifter 303, an adder 305 connected to the mixers 301 and 304 and a node 314, an output terminal 312 connected to the node 314, a BPF 306 connected to the node 314, a detector 307 connected to the BPF 306, and a control circuit 308 connected to the detector 307 and the minute amount-phase shifter 303. Here, it is assumed that the baseband signal I is a sine wave, and the baseband signal Q is a cosine wave. In this assumption, four values "00", "01", "10" and "11" are represented by the four combinations of $\pm 1/\sqrt{2}$ of the sine wave and $\pm 1/\sqrt{2}$ of the cosine wave.

Figure 4:
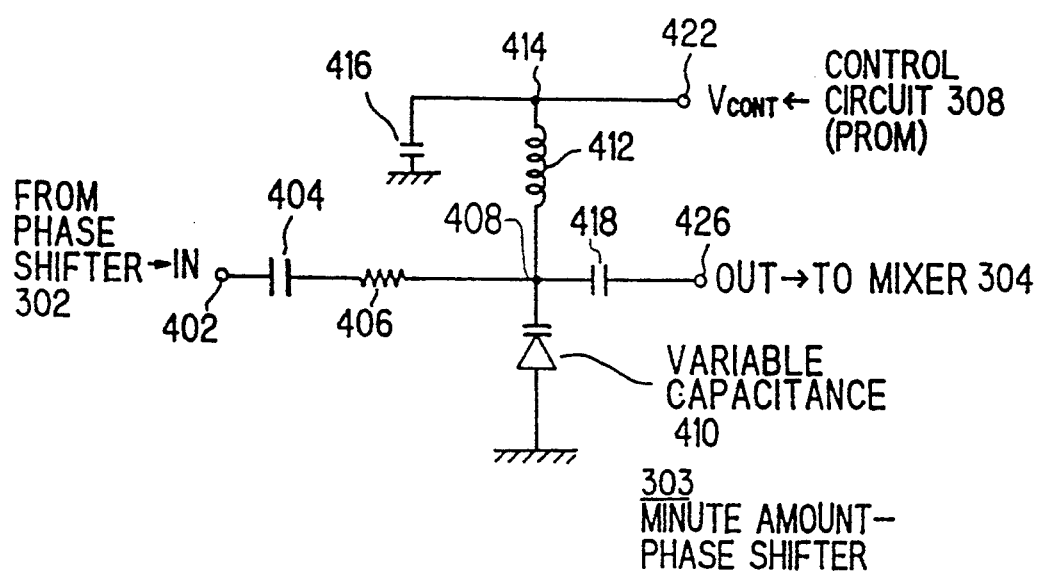
FIG. 4 is a circuit diagram showing a microphase shifter used in the first preferred embodiment shown in FIG. 3.

FIG. 4 shows a circuit diagram of the minute amount-phase shifter 303. The minute amount-phase shifter 303 includes an input terminal 402 connected to the phase shifter 302, a capacitance 404 connected to the input terminal 402, a resister 406 connected to the capacitance 404 and a node 408, a variable capacitance 410 connected between the node 408 and ground, an inductance 412 connected to the node 408 and a node 414, a capacitance 416 connected between the node 414 and ground, a capacitance 418 connected to the node 408, an output terminal 426 connected to the capacitance 418 and the mixer 304, and a control terminal 422 connected to the node 414 and the control circuit 308.

In operation, when the local signal "$L_O$" is supplied to the input terminal 310, the local signal "$L_O$" is divided at the node 313 into two local signals. The two divided local signals are supplied to the mixer 301 and the phase shifter 302. Thus, the baseband signal "I" is combined with the local signal "$L_O$" and the combined signal is supplied to the adder 305.

On the other hand, the divided local signal "$L_O$" is supplied to the phase shifter 302, so that the local signal "$L_O$" is phase-shifted by 90 degrees and the shifter signal is supplied to the minute amount-phase shifter 303, whereby the local signal is adjusted in phase by a minute amount. Then, the local signal which has been phase-adjusted is supplied to the mixer 304 whereby the baseband signal "Q" is combined with the local signal from the minute amount-phase shifter 303. After that, the combined signal is supplied to the adder 305.

The combined signals from the mixers 301 and 304 are added by the adder 305, whereby the RF signal is obtained. The RF signal thus modulated is supplied from the adder 305 through the output terminal 312 to the following stage.

On the other hand, the RF signal is monitored via the BPF 306 by the detector 307 whereby the RF signal is detected by a direct voltage signal. In accordance with a level of the direct voltage signal, a control signal to be supplied to the minute amount-phase shifter 303 is generated by the control circuit 308. A phase shifting amount of the minute amount-phase shifter 303 is adjusted in accordance with the control signal from the control circuit 308.

Figure 5:
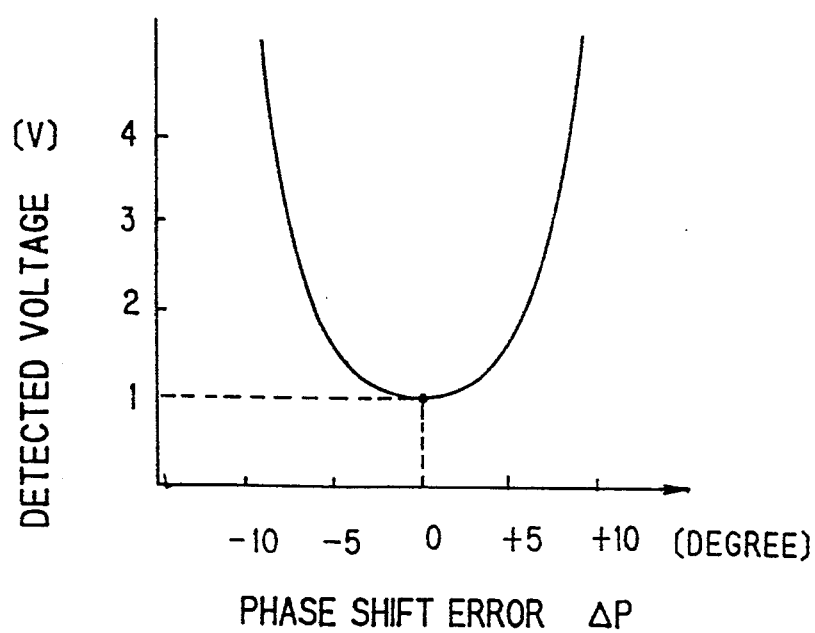
FIG. 5 is a correlation graph showing operation of the first preferred embodiment.

FIG. 5 is a correlation graph between an output voltage of the detector 307 and a phase error to be corrected at the minute amount-phase shifter 303 in accordance with the control signal. The control circuit 308 supplies a control signal having a level such that a direct voltage signal from the detector 307 has the minimum level. In other words, it is said considered that, when the two local signals have a relative phase difference of 90 degrees, a direct voltage signal supplied from the detector 307 has the minimum value.

In FIG. 5, the phase shift error is defined to be a difference of an actual phase difference of the two local signals from 90 degrees.

Next, the control operation of the control circuit 308 briefly mentioned before will be explained in conjunction with FIGS. 6 and 7.

Figure 7:
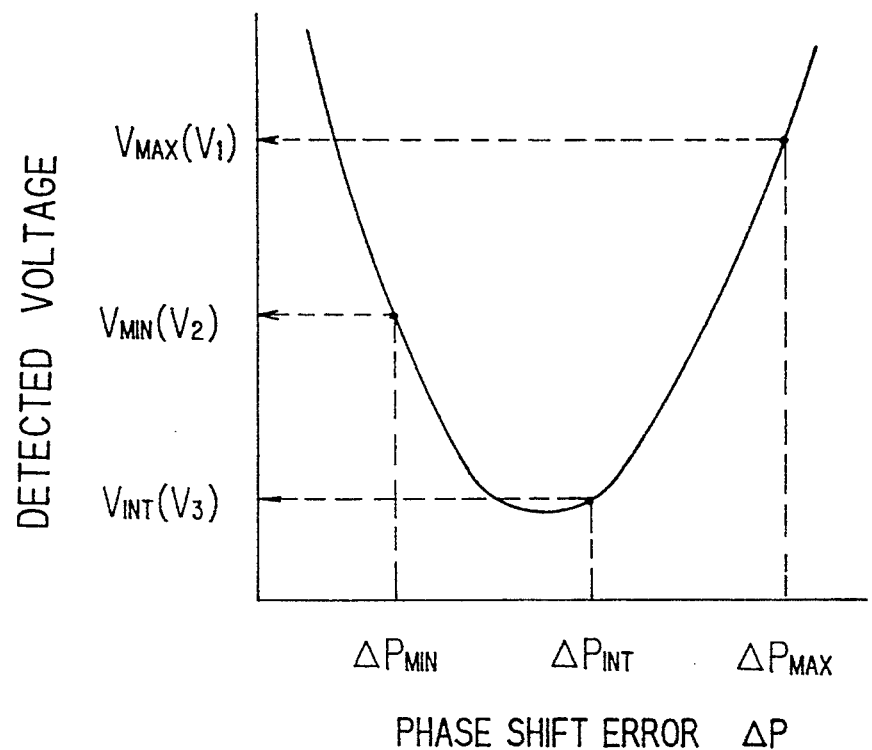
FIG. 7 is a correlation graph showing operation of the first preferred embodiment.

First, the control signal $V_{CONT}$ is supplied from the control circuit 308 to the terminal 422 of the minute amount-phase shifter 303, so that the phase difference between signals at the input and output terminals 402 and 426 becomes maximum and minimum (FIG.4). Thus, the detected voltages $V_{MAX}$ and $V_{MIN}$ are obtained at the maximum and minimum values $\Delta P_{MAX}$ $\Delta P_{MIN}$ of the phase shift errors $\Delta P$, as shown in FIG. 7.

Figure 6:
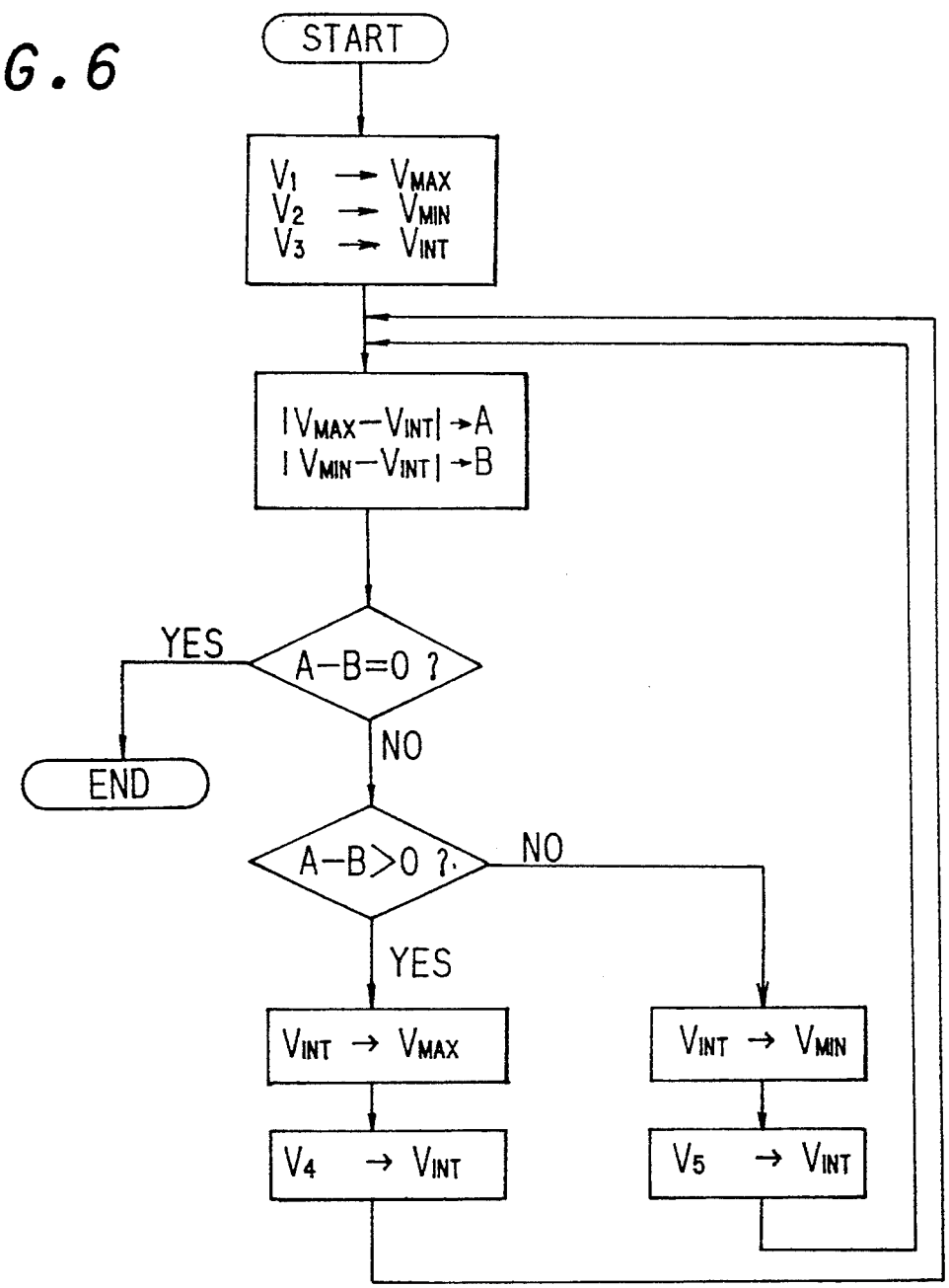
FIG. 6 is a flow chart showing operation of the first preferred embodiment.

In accordance with these results, an intermediate value $V_{INT}$ is calculated at intermediate value $\Delta P_{INT}$ of the phase shift errors $\Delta P_{MAX}$ and $\Delta P_{MIN}$. These values $V_{MAX}$, $V_{MIN}$ and $V_{INT}$ are stored as data $V_1$, $V_2$ and $V_3$ in the control circuit 308, as shown in FIG. 6. Then, the calculations $|V_{MAX}-V_{INT}|$ and $|V_{MIN}-V_{INT}|$ are carried out in the control circuit 308, and the results are stored as data A and B therein. Thereafter, the comparison between A and B is carried out in the control circuit 308. In this comparison, if A is equal to B (A=B), that is, $V_{MAX}$ is equal to $V_{MIN}$, it is determined that the phase shift error $\Delta P$ is zero, it means that the control signal supplied from the control circuit 308 is correct. On the other hand, if A is larger than B, that is, $V_{MAX}$ is larger than $V_{MIN}$, the stored $V_{MAX}$ is replaced by $V_{INT}$ which will be stored as $V_1$. Then, an intermediate value $V_4$ is newly calculated between the newly stored $V_1$ and the formerly stored $V_2$. Then, the same control flow as described above is repeated as shown in FIG. 6. On the contrary, if A is smaller than B, the stored $V_{MIN}$ is replaced by $V_{INT}$ which will be stored as $V_2$. Then, an intermediate value $V_5$ is newly calculated between the formerly stored $V_2$. Then, the same control is made as in the above explanation.

FIG. 8 shows a quadrature modulation circuit 800 of a second preferred embodiment according to the invention. The quadrature modulation circuit 800 includes input terminals 809 and 811 for baseband signals "I" and "Q", an input terminal 810 for a local signal "$L_O$" connected to a node 812, a mixer 801 connected to the input terminal 809 and the adder 305, a phase shifter 813 connected between the mixer 801 and the node 812, a phase shifter 814 connected to the node 812, a minute amount-phase shifter 803 connected to the node 812, and a mixer 804 connected to the input terminal 811, the minute amount-phase shifter 803 and the adder 305. The phase shifters 813 and 814 are used for shifting phase of the divided local signals by the summed amount of "A" and "B", respectively, where the summed amount is of 90 degrees.

In the second preferred embodiment, a phase shifting amount is adjusted by the minute amount-phase shifter 803 under control of the control circuit 308.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A quadrature modulation circuit, comprising:
   means for supplying a local signal and two baseband signals;
   means for dividing said local signal into two local signals;
   means for shifting a phase of at least one of said two local signals to provide a relative phase difference of 90 degrees therebetween;
   a first mixer for combining said first baseband signal with a first one of said two local signals, whereby a first combined signal is obtained;
   a second mixer for combining said second baseband signal with a second one of said two local signals, whereby a second combined signal is obtained;
   means for adding said first and second combined signals; and
   controlling means for controlling said shifting means in accordance with an output signal of said adding means, whereby said two local signals are adjusted to have a relative phase difference of 90 degrees, said controlling means comprises a band-pass filter for limiting a band of said output signal of said adding means, a detector for detecting a signal passing through said band-pass filter by a direct voltage signal, and a control circuit for controlling a shifting amount of said shifting means in accordance with said direct voltage signal from said detector.

2. A quadrature modulation circuit, comprising:
   means for supplying a local signal and two baseband signals;
   means for dividing said local signal into two local signals;
   means for shifting a phase of at least one of said two local signals to provide a relative phase difference of 90 degrees therebetween;
   a first mixer for combining said first baseband signal with a first one of said two local signals, whereby a first combined signal is obtained;
   a second mixer for combining said second baseband signal with a second one of said two local signals, whereby a second combined signal is obtained;
   means for adding said first and second combined signals; and
   controlling means for controlling said shifting means in accordance with an output signal of said adding means, whereby said two local signals are adjusted to have a relative phase difference of 90 degrees, said controlling means comprises a band-pass filter for limiting a band of said output signal of said adding means, a detector for detecting a signal passing through said band-pass filter by a direct voltage signal, and a control circuit for controlling a shifting amount of said shifting means in accordance with said direct voltage signal from said detector; said control circuit controlling a shifting amount of said shifting means to minimize said direct voltage signal from said detector.

* * * * *